United States Patent [19]
Mostafazadeh et al.

[11] Patent Number: 6,054,772
[45] Date of Patent: Apr. 25, 2000

[54] CHIP SIZED PACKAGE

[75] Inventors: Shahram Mostafazadeh, San Jose; Joseph O. Smith, Morgan Hill, both of Calif.

[73] Assignee: National Semiconductor Corporation, Santa Clara, Calif.

[21] Appl. No.: 09/070,111

[22] Filed: Apr. 29, 1998

[51] Int. Cl.[7] ............ H01L 23/48; H01L 23/52; H01L 29/40
[52] U.S. Cl. ............................... 257/781; 257/783
[58] Field of Search ..................... 257/783, 784, 257/782, 778, 779, 780, 781, 787

[56] References Cited

U.S. PATENT DOCUMENTS

| | | | |
|---|---|---|---|
| 5,159,434 | 10/1992 | Kohno et al. | 257/784 |
| 5,373,190 | 12/1994 | Ichiyama | 257/787 |
| 5,496,775 | 3/1996 | Brooks . | |
| 5,554,887 | 9/1996 | Sawai et al. | 257/787 |
| 5,650,667 | 7/1997 | Liou | 257/780 |
| 5,777,385 | 7/1998 | Wu | 257/783 |

*Primary Examiner*—Sheila V. Clark
*Attorney, Agent, or Firm*—Beyer Weaver Thomas & Nguyen, LLP

[57] ABSTRACT

An improved wafer based packaging arrangement for integrated circuits is disclosed. In one aspect of the invention, external contacts are formed for the packaged integrated circuits by contact studs formed from bonding wires. One end of each contact studs is ball bonded to an associated wafer bond pad. An elongated portion of each wire (contact stud) extends outward the wafer surface and terminates at a second end that forms an external contact. Filling material surrounds a significant portion of the contact studs to hold the studs in place but leaves at least a portion of the second ends exposed to form external contacts. In some embodiments, the external contacts are substantially coplanar with the surface of the filling material, while in others, a protrusion beyond the filling material surface is left to form a contact bump. The wafers are eventually diced to form discrete packaged integrated circuits having external contacts formed by the contact studs.

15 Claims, 3 Drawing Sheets

Cross section of wafer after encapsulation

Rise of capillary to a specific height

Bonded wire to the pad with ball at the other end

Cross section of wafer after bond

Cross section of wafer after encapsulation

Cross section of encapsulated wafer after planarization

CHIP SIZED PACKAGE

BACKGROUND OF THE INVENTION

The present invention relates generally to semiconductor packaging. More particularly, a packaging arrangement that utilizes bonding wires as external contacts is described.

In the semiconductor industry, there are continuous pressures to reduce the cost of packaging integrated circuits. To accomplish this, a wide variety of package designs and assembly methods have been developed. One of the currently used techniques for producing integrated circuit (IC) packages is referred to as flip chip packaging. Flip chip packages are typically produced by attaching solder balls or solder columns to input/output terminal pads on the top surface of an integrated circuit die. The solder balls or columns form interconnecting contacts that are used to connect the die to other electrical elements such as a printed circuit board. During the assembly of the flip chip package onto a substrate such as a printed circuit board, the integrated circuit die is flipped upside down such that the solder balls or columns face the substrate and the die is then attached to the substrate. FIGS. 1 is a cross sectional view illustrating a typical flip chip package, designated by reference numeral 10, that is attached to a substrate material such as printed circuit board 12.

As shown in FIG. 1, flip chip package 10 includes an integrated circuit die 14 and a plurality of solder ball or solder column interconnecting contacts 16. Interconnecting contacts 16 are attached to associated input/output terminal pads 18 formed on a surface 20 of integrated circuit die 14. Interconnecting contacts 16 are used to electrically connect integrated circuit die 14 to a substrate such as printed circuit board 12. Because interconnecting contacts 16 are rigid columns or solder balls, these interconnecting contacts form rigid connections between integrated circuit die 14 and printed circuit board 12. These rigid connections are susceptible to cracking or separation due to vibration and/or thermo-mechanical stresses placed on the finished printed circuit board. In order to improve the reliability of the mechanical connection between the flip chip package 10 and the printed circuit board 12, an epoxy material 22 or other such adhesive material is used to underfill flip chip package 10 and adhere package 10 to printed circuit board 12 after the package is assembled onto the printed circuit board. This underfill process is an extra step in the assembly process and adds to the cost of assembling the system using this type of flip chip package. Indeed, one of the greatest drawbacks of current flip chip technology is that the production and assembly costs are too high in many circumstances. Additionally, as die sizes are reduced and die complexity is increases, there are ongoing needs to create finer pitch interconnects. Solder balls 16 tend to be relatively large and thus in some circumstances the die size reductions are limited by external interconnect constraints. Thus, simpler and lower cost packaging techniques that utilize proven technologies and meet the needs of current integrated circuits would be desirable.

One well established packaging technology is wire bonding. Recently, there have been some attempts to utilize wire bonding techniques in the formation of contacts or flip chip and/or chip scale packages. By way of example, U.S. Pat. No. 5,496,775 to Brooks contemplates forming towers of gold ball bonds on top of one another to form a contact. The towers are then partially backfilled, which helps hold them in place. However, it is relatively difficult to build reliable ball bond towers without damaging the underlying bond pads. In commonly assigned, co-pending application Ser. No. 08/998,442 filed Dec. 24, 1997 (which is incorporated herein by reference), Kelkar et al. take another approach which contemplates the use of wire bond loops as contacts. These loops may also be backfilled for support. Although this approach works well, additional contact forming techniques are always desirable.

SUMMARY OF THE INVENTION

To achieve the foregoing and other objects and in accordance with the purpose of the present invention, an improved wafer based packaging arrangement for integrated circuits is disclosed. In one aspect of the invention, external contacts are formed for the packaged integrated circuits by contact studs formed from bonding wires. One end of each contact studs is ball bonded to an associated wafer bond pad. An elongated portion of each wire (contact stud) extends outward from the wafer surface and terminates at a second end that forms an external contact. Filling material surrounds a significant portion of the contact studs to hold the studs in place but leaves at least a portion of the second ends exposed to form external contacts. In some embodiments, the external contacts are substantially coplanar with the surface of the filling material, while in others, a protrusion beyond the filling material surface is left to form a contact bump. The wafers are eventually diced to form discrete packaged integrated circuits having external contacts formed by the contact studs.

In some embodiments the encasing step includes substantially encapsulating the contact studs with the filling material and lapping back an exposed surface of the filling material. This forms a substantially flat mounting surface on the wafer having contacts formed therein by the contact studs.

In a method aspect of the invention, the encasing step includes positioning a dam around an edge portion of the wafer and at least partially filling a cavity formed by the dam and wafer with the filling material. The filling material is then set to fix the contact studs in place. In some embodiments, the wafer is mounted on a wafer frame suitable for use during the dicing operation prior to the encasing step such that the encasing is done while the wafer is mounted on the wafer frame. In some implementations, the wafer may be mounted on the wafer frame prior to the wire bonding.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

An invention is herein described for utilizing bonding wires as external contacts for integrated circuit package components. In the following description, numerous specific details are set forth in order to provide a thorough understanding of the present invention. However, in view of this description, it will be obvious to one skilled in the art that the present invention may be embodied in a wide variety of specific configurations. Also, well known integrated circuit package manufacturing processes such as wire bonding processes, integrated circuit package encapsulating or molding processes, singulating process, and other such conventional integrated circuit manufacturing processes will not be described in detail in order not to unnecessarily obscure the present invention.

Wire bonding is a widely used technique within the semiconductor packaging industry. Typically, one end of a bonding wire is attached to a bond pad on a die while the other end is attached to an appropriate interconnect such as a lead on a lead frame or traces on a substrate. In some cases, die to die wire bonds are contemplated as well. As is well known to those skilled in the art, the first end of a bonding wire is typically "ball" bonded to an appropriate surface using a capillary. Then the bonding wire is extruded through the capillary while the capillary is positioned over a second contact spot. A "wedge" or "stitch" bond is then typically formed at the second contact spot. To create a ball bond, a predefined amount of bonding wire is extruded through the capillary and melted using a flame off mechanism which today is generally electric. The surface tension of the melted wire then forms the ball which is then thermosonicially or ultrasonically welded to the appropriate surface. The present invention seeks to utilize well established bonding wire technology to form external contacts on a packaged semiconductor device.

Figure 1:
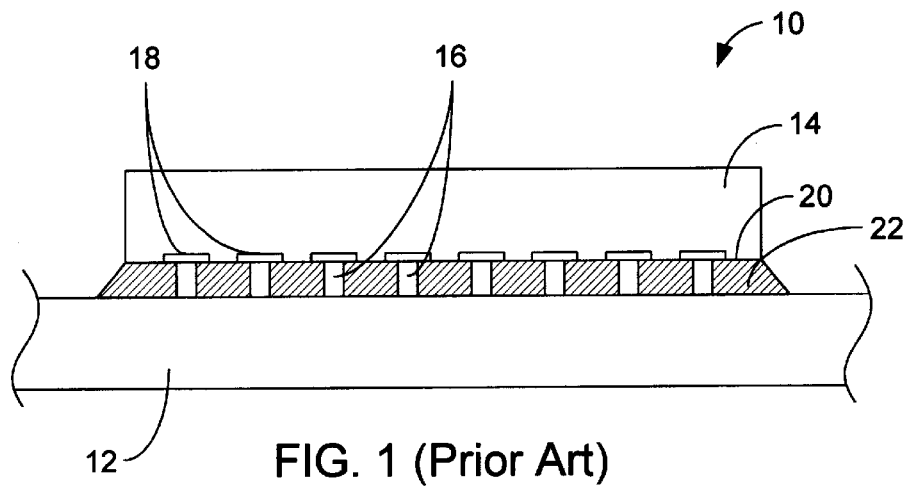
FIG. 1 is a diagrammatic cross sectional view of a prior art flip chip package.
Figure 2:
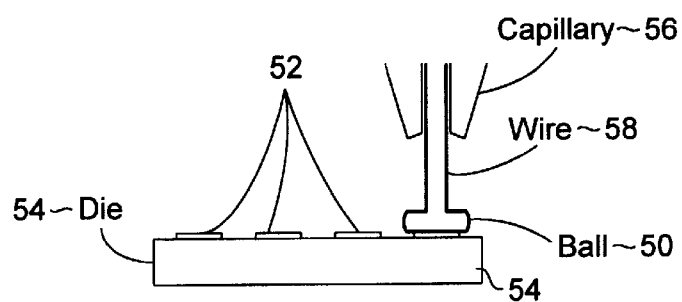
FIG. 2 is a diagrammatic cross sectional view of a die having a wire bonding contact stud being formed thereon.

Referring next to FIG. 2, in a described embodiment of the present invention, a standard ball bond 50 is formed on a bond pad 52 on integrated circuit package component 54 using capillary 56. Integrated circuit package component 54 may be any integrated circuit package component on which an interconnecting contact is to be formed. This includes, but is not limited to, integrated circuit dice, interconnecting substrates for interconnecting other integrated circuit package components, and substrates for connecting an overall integrated circuit package to other electrical elements. In the case of a flip chip package similar the one described above with reference to FIG. 1, integrated circuit package component 54 would take the form of an integrated circuit die.

Figure 3:
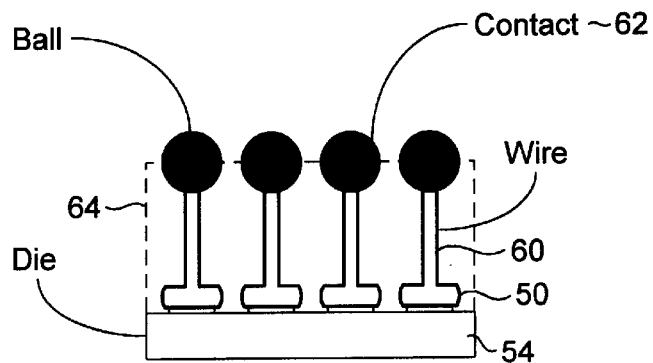
FIG. 3 is a diagrammatic cross sectional view of a die having a plurality of contact studs formed thereon.

After the ball bond has been formed, the capillary 56 is raised to a specific height above the ball bond 50 and the bonding wire 58 is cut off creating a contact stud 60 as best illustrated in FIG. 3. A conventional flame off mechanism (not shown) typically used to melt the distal end of bonding wire 58 may be used to cut the top end of the contact stud as well. When the bonding wire is cut, a small portion is melted. In some circumstances this may lead to the formation of a contact ball 62 on the upper end of the contact stud 60. Once the bonding wire 58 has been cut, a vertically extending contact stud 60 is formed above the bond pad 52 and the capillary moves to the next bonding pad to form another contact stud. Contact studs 60 may then be formed on each of the bond pads 52 which are intended to be coupled to external contacts.

When forming the contact studs 60, there are wide variety of variables that may be adjusted to meet the needs of a particular system. By way of example, the diameter of the bonding wires, the height of the contact studs, and the size of a contact balls 62 formed at the free end of the contact studs 60 may all be widely varied in accordance with the needs of a particular application. As will be appreciated by those skilled in the art, common bonding wire diameters for state of the art applications are on the order of 1 to 1.6 mils. Although such wire diameters work well with the present invention, it is also possible to use larger diameter wires. For example, 2 mil diameter bonding wires work well since the intent is to form external contacts and in many situations the limiting factor on external contact pitch is not going to be the bonding wire diameter. Accordingly, larger diameter wires can be used to form relatively larger and stronger contacts and to improve manufacturability. It is noted that 2 mil diameter bonding wires were quite common in the recent past and that equipment for producing bonding wires of this larger diameter is also readily available. In fact, in high power applications, the larger diameter bonding wires are still often utilized. Since the described contact studs are utilized as contacts for connecting the integrated circuit package component to other electrical elements, the larger diameter bonding wires are generally preferable in order to provide stronger contacts. However, as stated above, this is not a requirement.

The height of the contact studs may also be widely varied depending upon the design constraints of a particular system. By way of example, heights in the order of 10 to 50 mils and preferably 20–30 mils are appropriate in many applications. As is well known to those skilled in the art, the size of the ball bond 50 is primarily dependent upon the size of a free air ball formed prior to the ball bonding step. Similarly, the size of the contact ball 62 can be controlled to some extent based upon the amount of energy used to sever the free end of the contact stud 60. The contact studs may be formed from any conventional bonding wire material including, but not limited to gold, copper, silver and any other bonding wire material including various alloys.

After the contact studs 60 have all been formed, an encapsulating material 64 (shown in dashed lines in FIG. 3) is used to encase the contact studs to firmly hold them in place. The encapsulating material 64 used for any particular application may be widely varied but since the bonding wires are relatively easy to bend, it is generally desirable to use a material that is relatively non-viscous when it is applied. By way of example, glob topping materials such as epoxy work well.

Figure 4:
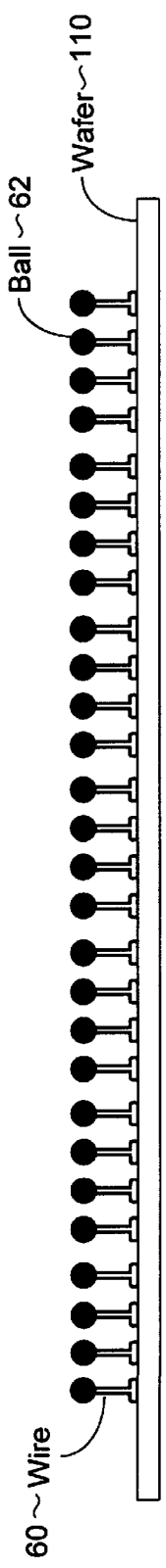
FIG. 4 is a diagrammatic cross sectional view of a wafer in accordance with one embodiment of the present invention after contact studs have been formed thereon.
Figure 5:
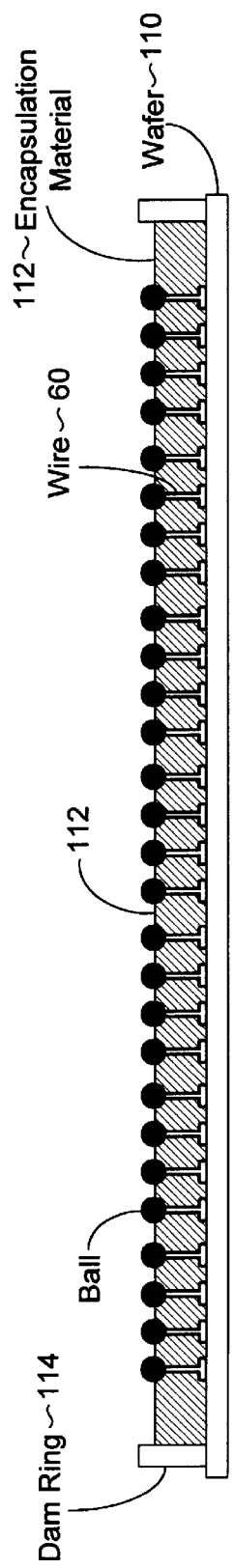
FIG. 5 is a diagrammatic cross sectional view of the wafer of FIG. 4 after an encapsulation that forms contact bumps.
Figure 6:
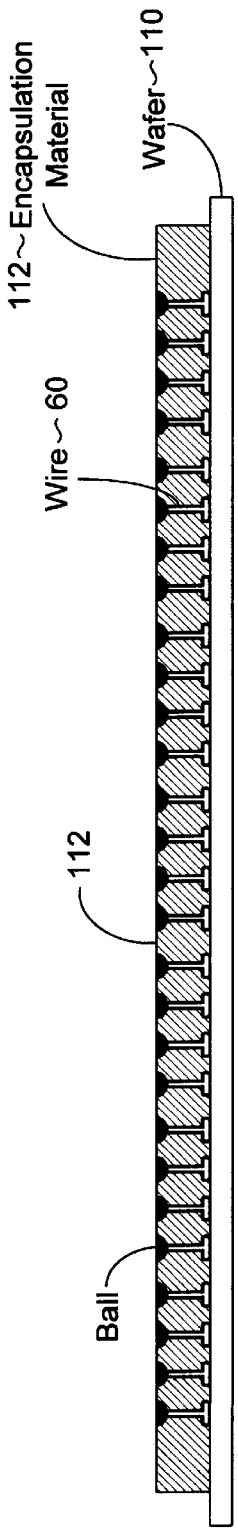
FIG. 6 is a diagrammatic cross sectional view of a packaged integrated circuit in accordance with another embodiment of the present invention wherein the encapsulant and contact studs are planarized.

The attachment of the contact studs 60 as illustrated in FIGS. 2 and 3 are described in the context of being attached directly to a die. Although the invention will work well as attached to singulated dies, in many situations it will be more efficient to do the wire bonding at the wafer level. That is, the contact studs 60 may be attached to the wafer 110 prior to dicing. This approach is illustrated in FIGS. 4 and 5. In this embodiment, each bonding pad that is to have an associated contact stud is wire bonded to form the contact stud as described above with respect to FIGS. 2 and 3. The only difference is that the wire bonding is done on the wafers. After all of the desired contact studs have been formed as illustrated in FIG. 4, the encapsulation may be done on the wafer level as illustrated in FIG. 5. Specifically, encapsulating material 112 is placed over all of the dice on wafer 110. To facilitate encapsulation, a dam ring 114 may be placed around a peripheral portion of the wafer. A cavity formed by the wafer 110 and the dam 114 is then filled with an appropriate encapsulating material to encase the contact studs 60. As will be appreciated by those skilled in the art, the mechanism used to accomplish this encapsulation may be widely varied to meet the needs of a particular application. As with the die based encapsulation, the encapsulating material 112 may be filled in to a level just below the free tips of contact studs 60 such that the contact balls 62 protrude above the encapsulating material 112. Alternatively, the encapsulating material may be a bit deeper and the exposed surface of the encapsulating material and contact studs 60 lapped back to planarize the exposed surface 120. This is best illustrated in FIG. 6 which shows the planarized surface 120 wherein the contacts 124 formed by contact studs 60 are coplanar with the exposed surface of the encapsulating material 112.

Figure 7:
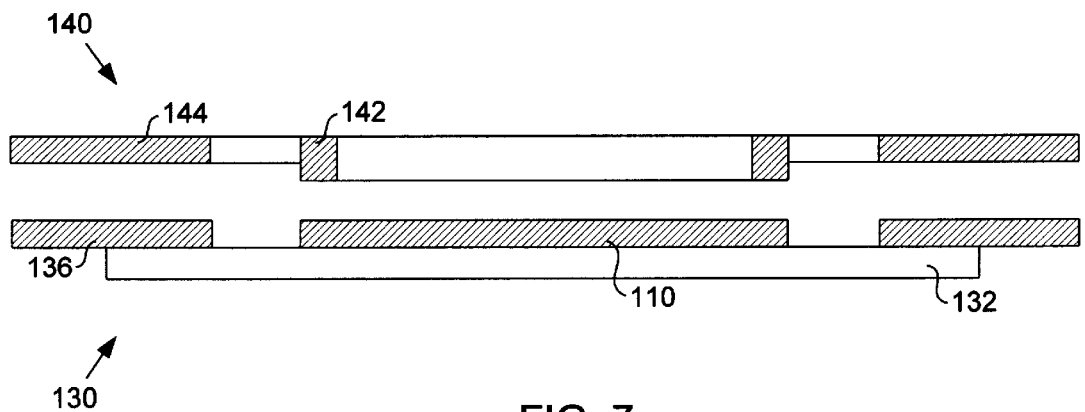
FIG. 7 is a diagrammatic cross sectional view of an encapsulating chamber formed from a wafer frame and a mating dam structure suitable for encapsulating the contact studs in accordance with one method aspect of the present invention.

Referring next to FIG. 7, one damming structure suitable for use in encapsulating the contact studs will be described. In the embodiment shown, a wafer 110 is mounted on a conventional dicing wafer frame 130. More specifically, the wafer 110 is mounted on the tape portion 132 of wafer frame 130. An encapsulating frame 140, having a dam ring 142 and a support ring 144, is placed over the wafer to form a dam around wafer 110. The support ring 144 of the encapsulating frame 140 meets with frame ring 136 of wafer frame 130 to support the encapsulating frame 140. When properly positioned, the dam ring 142 rests on an outer portion of the wafer 110 to form an encapsulating chamber about the contact studs. Encapsulating material may then be poured into the encapsulating chamber to encase the contact studs. One advantage of the described encapsulating frame is that it permits the wafer to be mounted on the wafer frame early during its packaging processing which facilitates ease of handling during packaging. After the encapsulating material is poured into the encapsulating chamber, the wafer frame may be moved to an appropriate spot to facilitate setting the encapsulating material. For some encapsulating materials it may be desirable to set the encapsulating material at an elevated temperature. In such circumstances, the wafer frame/encapsulating frame structure may be directly placed in an oven or other suitable heating location. After the encapsulating material is set, the exposed surface may optionally be planarized and the wafer diced. Both the lapping of the exposed surface for the encapsulating material and the dicing step may also be accomplished while the wafer is mounted on the wafer frame 130. In some embodiments, it may be desirable to mount the wafer to the wafer frame even before the wire bonding.

The geometry of the dam ring 142 may take a variety of shapes. In one described embodiment, the dam ring 142 is sized to rest on the outer edge of the top surface of the wafer 110 as illustrated in FIG. 7. With this arrangement scribe marks used to position a wafer saw during a standard wafer sawing operation remain exposed which simplifies the dicing operation. In another embodiment, the dam may tightly fit around the periphery of the wafer as illustrated in FIG. 5.

Figure 8:
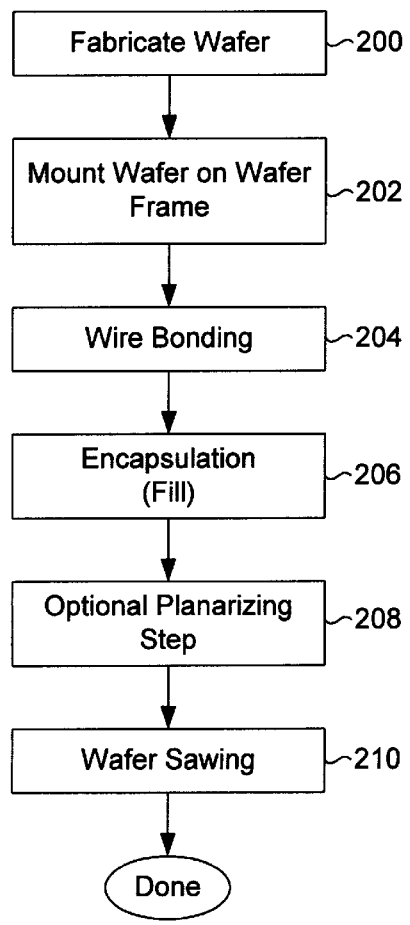
FIG. 8 is a flow chart illustrating a packaging technique in accordance with another method aspect of the present invention.

Referring next to FIG. 8, one wafer-based method of packaging integrated circuits in accordance with an embodiment of the present invention will be described. Initially, in step 200 the wafer 110 is fabricated using conventional techniques. Once wafer fabrication is completed, the wafer 110 may be mounted on a wafer frame such as wafer frame 130 illustrated in FIG. 7. (Step 202). With the wafer mounted on a wafer frame, a substantially convention wire bonder may be used to form the contact studs 60 in step 204 as described above. After the wire bonding has been completed, the contact studs are encapsulated in step 206 and the exposed surface of the encapsulating material may optionally be planarized in step 208, both as described above. Once the encapsulation and/or planarization has been completed, the dice may be singulated using a conventional wafer sawing technique in step 210. Although in the embodiment illustrated the wafer mounting step 202 takes place before the wire bonding step 204, as pointed out above, the wafer mounting step 202 may take place at any suitable point before the dicing operation. In processes where a wafer frame is not needed for dicing, the wafer mounting step 202 may optionally be eliminated if it is not desired for ease of handling.

The described bonding wire interconnecting contacts provide significant advantages over other prior art methods of forming interconnecting contacts. Since conventional wire bonding equipment is used to form the interconnecting contacts, wire bonding equipment that is commonly used for many other integrated circuit package production steps may also be used to form the interconnecting contacts. This leverages the use of the wire bonding equipment and eliminates the need for special equipment to form the interconnecting contacts.

Although only a few embodiments of the present invention have been described in detail, it should be understood that the present invention may be embodied in many other specific forms without departing from the spirit or scope of the invention. For example, the nature of the materials used for the encapsulation, the types of wire bonder utilized to make the contact studs and the wafer handling techniques may all be widely varied without departing from the invention. Further, the contact studs have been described as being substantially vertical, it should be appreciated that they may be tilted or swept with respect to the vertical axis without departing from the spirit of the invention. Additionally, the size of the contact ball formed during flame off may also be widely varied without departing from the invention. Additionally, although the bonding wires described above have been described as having a diameter which suggests the bonding wires are circular in cross section, this is not a requirement. Instead, it should be understood that the bonding wires may have any cross sectional shape and still remain within the scope of the invention. These cross sectional shapes include elliptical cross sections, flattened ribbon like cross sections, square cross sections, or any other desired cross sectional shape. Therefore, the present examples are to be considered as illustrative and not restrictive, and the invention is not to be limited to the details given herein, but may be modified within the scope of the appended claims.

We claim:

1. A packaged integrated circuit comprising:

an integrated circuit package component having a multiplicity of bond pads arranged on a first surface thereof;

a multiplicity of bonding wire contacts having substantially uniform heights, each bonding wire having a first end that is ball bonded to an associated bond pad and an elongated portion that extends substantially perpendicularly to the first surface of the integrated circuit package component and terminates at a second end that forms an external contact, the elongated portion being formed from substantially unmelted bonding wire and having a height of greater than approximately 20 mils;

a filling material that surrounds a significant portion of the bonding wires to hold the bonding wires in place, but leaves at least a portion of the second ends exposed to form external contacts.

2. A packaged integrated circuit as recited in claim 1 wherein the integrated circuit package component is a die and the external contacts are substantially coplanar with a surface of the filling material.

3. A packaged integrated circuit as recited in claim 1 wherein the integrated circuit package component is a die and the external contacts are bumps that rise above a surface of the filling material.

4. A packaged integrated circuit as recited in claim 1 wherein the filling material is an epoxy type material that covers only the first surface of the integrated circuit package component.

5. A packaged integrated circuit as recited in claim 1 further comprising contact balls formed at the second ends of the respective contact studs to form the external contacts, the contact balls having a diameter greater than that of the elongated portion of their associated bonding wires and being integrally formed with their associated bonding wires during flame off of the second ends of the bonding wires.

6. A packaged integrated circuit comprising:
an integrated circuit package component having a multiplicity of bond pads arranged on a first surface thereof;
a multiplicity of bonding wire contacts, each bonding wire having a first end that is ball bonded to an associated bond pad, an elongated portion, and a contact ball at a second end that forms an external contact, the contact ball having a diameter greater than that of the elongated portion of the associated bonding wire, and being integrally formed with the bonding wire during flame off of the second end of the bonding wire, the elongated portion being formed from substantially unmelted bonding wire; and
a filling material that surrounds a significant portion of the bonding wires to hold the bonding wires in place, but leaves at least a portion of the second ends exposed to form external contacts.

7. A packaged integrated circuit as recited in claim 6 wherein the integrated circuit package component is a die and the external contacts are substantially coplanar with a surface of the filling material.

8. A packaged integrated circuit as recited in claim 6 wherein the integrated circuit package component is a die and the contact balls form bumps that rise above a surface of the filling material.

9. A packaged integrated circuit as recited in claim 6 wherein the filling material is an epoxy type material that covers only the first surface of the integrated circuit package component.

10. A semiconductor wafer comprising:
a plurality of dice, each integrated circuit package component having a multiplicity of bond pads arranged on a first surface of the wafer;
a multiplicity of bonding wire contacts, each bonding wire having a first end that is ball bonded to an associated bond pad and an elongated portion that extends substantially perpendicularly to the first surface of the wafer and a contact ball at a second end that forms an external contact, the contact ball having a diameter greater than that of the elongated portion of the associated bonding wire and being integrally formed with the bonding wire during flame off of the second end of the bonding wire, the cross-sectional areas along a continuous length of said elongated portion being substantially uniform; and
a filling material that surrounds a significant portion of the bonding wires to hold the bonding wires in place but leaves at least a portion of the second ends exposed to form external contacts.

11. A semiconductor wafer as recited in claim 10 wherein the external contacts are substantially coplanar with a surface of the filling material.

12. A packaged integrated circuit as recited in claim 6 wherein the elongated portion has a height in the range of approximately 20 to 50 mils.

13. A packaged integrated circuit as recited in claim 1 wherein the elongated portion has a height between approximately 20 and 30 mils.

14. A packaged integrated circuit as recited in claim 6 wherein the elongated portion has a diameter of greater than 1.6 mil.

15. A packaged integrated circuit comprising:
an integrated circuit package component having a multiplicity of bond pads arranged on a first surface thereof;
a multiplicity of bonding wire contacts having substantially uniform heights, each bonding wire having a first end that is ball bonded to an associated bond pad and an elongated portion that extends substantially perpendicularly to the first surface of the integrated circuit package component and terminates at a second end that forms an external contact, the elongated portion being formed from substantially unmelted bonding wire and having a diameter greater than 1.6 mils; and
a filling material that surrounds a significant portion of the bonding wires to hold the bonding wires in place, but leaves at least a portion of the second ends exposed to form external contacts.

* * * * *